United States Patent
Frey et al.

(10) Patent No.: US 8,647,961 B2
(45) Date of Patent: Feb. 11, 2014

(54) METHOD FOR FILLING CAVITIES IN WAFERS, CORRESPONDINGLY FILLED BLIND HOLE AND WAFER HAVING CORRESPONDINGLY FILLED INSULATION TRENCHES

(75) Inventors: Jens Frey, Filderstadt (DE); Heribert Weber, Nuertingen (DE); Eckhard Graf, Gomaringen (DE); Roman Schlosser, Waldkirch (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/198,651

(22) Filed: Aug. 4, 2011

(65) Prior Publication Data
US 2012/0038030 A1    Feb. 16, 2012

(30) Foreign Application Priority Data
Aug. 13, 2010    (DE) .......................... 10 2010 039 298

(51) Int. Cl.
*H01L 21/76*    (2006.01)

(52) U.S. Cl.
USPC ............. 438/424; 438/42; 438/612; 438/666; 438/700; 257/622; 257/734

(58) Field of Classification Search
USPC .................. 257/374, 510, 618, 622, E23.131, 257/E21.238, E21.585, 396, 397, 734, 774, 257/776, 621, 739, 623, 786, 789, 790, 792, 257/795; 438/FOR. 227, FOR. 407, 257, 438/259, 296, 596, 595, 319, 359, 42, 221, 438/424, 700, 612, 978, 666, 127, 637, 639, 438/640, 713, 39, 701
See application file for complete search history.

(56) References Cited

U.S. PATENT DOCUMENTS

| | | | | |
|---|---|---|---|---|
| 6,461,717 B1 * | 10/2002 | Rutter et al. | ................... | 428/139 |
| 6,544,858 B1 * | 4/2003 | Beekman et al. | ............. | 438/400 |
| 7,601,588 B2 * | 10/2009 | Choi et al. | .................... | 438/257 |
| 2002/0110665 A1 * | 8/2002 | Rutter et al. | ................... | 428/137 |

FOREIGN PATENT DOCUMENTS

EP    1 744 353    1/2007

* cited by examiner

*Primary Examiner* — Thanh Y Tran
(74) *Attorney, Agent, or Firm* — Kenyon & Kenyon LLP

(57) ABSTRACT

A method is described for filling cavities in wafers, the cavities being open to a predetermined surface of the wafer, including the following steps: applying a lacquer-like filling material to the predetermined surface of the wafer; heating the wafer at a first temperature; driving out gas bubbles enclosed in the filling material by heating the wafer under vacuum at a second temperature which is equal to or higher than the first temperature; and curing the filling material by heating the wafer at a third temperature which is higher than the second temperature. Furthermore, also described is a blind hole filled using such a method and general 3D cavities as well as a wafer having insulation trenches of a silicon via filled using such a method.

10 Claims, 3 Drawing Sheets

METHOD FOR FILLING CAVITIES IN WAFERS, CORRESPONDINGLY FILLED BLIND HOLE AND WAFER HAVING CORRESPONDINGLY FILLED INSULATION TRENCHES

RELATED APPLICATION INFORMATION

The present application claims priority to and the benefit of German patent application no. 10 2010 039 298.7, which was filed in Germany on Aug. 13, 2010, the disclosure of which is incorporated herein by reference.

FIELD OF THE INVENTION

The present invention relates to a method for filling cavities in wafers, a blind hole in a wafer filled using such a method and a wafer having insulation trenches filled using such a method.

BACKGROUND INFORMATION

In the context of manufacturing wafers, it is known to fill vias in the form of metallic hollow vias using a filling material as discussed, for example, in EP 1 744 353 A1.

SUMMARY OF THE INVENTION

The method according to the present invention for filling cavities in wafers according to the description herein and the blind hole according to the description herein filled using such a method as well as the wafer having insulation trenches according to the description herein filled using such a method provide possibilities for the void-free filling of cavities.

The exemplary embodiments and/or exemplary methods of the present invention provide that when cavities in wafers are filled using a lacquer-like filling material, gas bubbles that occur may be removed if a first heating step used for driving solvents out of the filling material is followed by an additional heating step at a temperature which is equal to or higher than in the first heating step, the additional heating step being carried out under vacuum. After the gas bubbles are driven out, the filling material is cured in a third heating step at a temperature that is higher than in the first and second heating steps. This makes it possible to fill cavities in wafers such as blind holes or insulation trenches of silicon vias without the formation of voids. The method according to the present invention makes fillings up to a trench width of 30 µm and a depth greater than 200 µm and fillings having an aspect ratio above 1/40 possible. The filling of cavities in wafers also makes the further processing of wafers structured in this way possible. In particular, the wafer may afterwards be structured again using standard lithography methods, since the filling material planarizes the wafer surface. The lacquer-like filling material is applied to the wafer surface using rotation coating in particular. Standard systems, such as a spin coater and vacuum oven, may thus be used so that the expense required for the method is kept low.

Advantageous refinements and improvements of the particular object of the exemplary embodiments and/or exemplary methods of the present invention are found in the subclaims.

It is advantageous in particular if the filling material is a material which is liquid at the second temperature. Even complexly shaped cavities having undercuts or widening or narrowing trenches and even lateral cavities may be filled using the filling process supported by capillary forces and the vacuum process. Furthermore, the modulus of elasticity of the filling material should be adequately high. It is also favorable if the thermal coefficient of expansion of the filling material is as similar as possible to that of the wafer material, which is silicon in particular. This may be achieved, for example, if the thermal coefficient of expansion of the filling material is made to approximate that of silicon by introducing additional filling substances such as silicon dioxide nanoparticles.

Additional desirable properties of the filling material are a lower absorption of humidity and a high electrical resistance for specific applications. The use of a temperature-resistant filling material makes further processing of the wafer possible, including process steps at higher temperatures, in particular up to 450° C., making multi-layer wiring, planarization, etc., possible. High temperature-resistant filling materials allow further processing of the wafer including, for example, oxide deposition. This makes a multi-layer wiring using oxide or polymer as an insulating intermediate layer possible. Finally, the filling material may be designed to be photosensitive, which makes photolithographic structuring of the filling material possible.

According to a specific embodiment of the present invention, the filling material is a polymer. Polyimides or a benzocyclobutene compound are particularly well suited, in particular the substance B-staged divinylsiloxane-bisbenzocyclobutene resin known by the trade name Cyclotene 3022-63.

According to a specific embodiment of the present invention, the third temperature is lower than 250° C. Since in this case all process steps of the method take place at temperatures below 250° C., the method may also be used at the end of the wafer processing in the case of wafers whose elements are able to withstand only low thermal stress.

According to a specific embodiment of the present invention, the cavity is a metallic hollow via or an insulation trench of a silicon via.

According to a particularly specific embodiment of the present invention, the method includes an additional step in which the filling material applied to the predetermined surface of the wafer is structured for exposing terminal contacts of the metallic hollow via or the silicon via. Since the filling material is left on the wafer surface and only the terminal contacts are opened, the filling material located on the wafer surface may be used as insulation for a metallic redistribution wiring and multi-layer wiring on the wafer surface.

According to an alternative particularly specific embodiment of the present invention, the method includes an additional step in which the filling material applied to the predetermined surface of the wafer is removed from the wafer surface for exposing terminal contacts of the metallic hollow via or the silicon via. This may be done in three different ways. The filling material located on the wafer surface may be etched back by reactive ion etching. Alternatively, the filling material may be removed before curing in the third heating step by rinsing using solvent or wet chemical spin etching. As a third alternative, the filling material may be removed by polish grinding.

DETAILED DESCRIPTION

Identical reference symbols in the figures denote identical components or components having an identical function.

Figure 1:
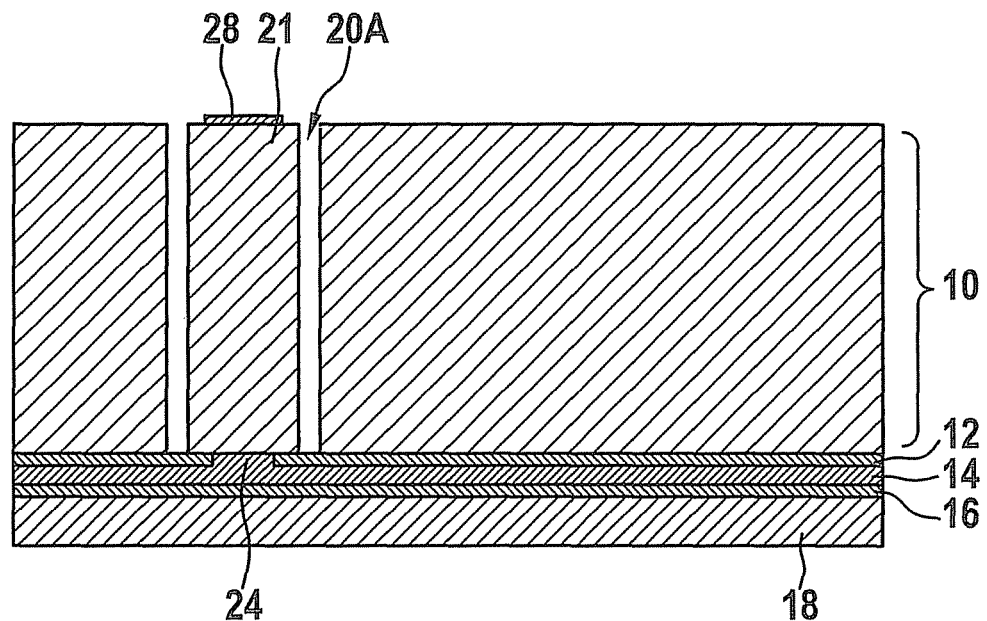
FIG. 1 shows a cross-sectional view of a wafer having insulation trenches of a silicon via corresponding to a first specific embodiment of the present invention.

FIG. 1 is a cross-sectional view of a wafer having insulation trenches of a silicon via.

According to the first exemplary embodiment of the present invention, the cavities to be filled are insulation trenches 20A of a silicon via. The wafer shown in FIG. 1 includes a silicon substrate 10, which is heavily doped, an oxide layer 12 on the silicon substrate, a buried printed conductor track 14 made of heavily doped polycrystalline silicon on oxide layer 12, another oxide layer 16 on buried printed conductor track 14 and a functional layer 18 on oxide layer 16. The surface of substrate 10, which faces away from buried printed conductor track 14 and is situated at the top in the figure, forms the back of the wafer. A silicon via having insulation trenches 10A and a contact piston 21 is formed in silicon substrate 10. Contact piston 21 is a sub-area of substrate 10 which is separated from the rest of the substrate by insulation trenches 20A, which extend from the back of the wafer to oxide layer 12, and is thus electrically insulated. On the side facing buried printed conductor track 14, contact piston 21 is connected to buried printed conductor track 14 via an electrically conductive connection 24. A metallic bond pad 28 as a terminal contact on contact piston 21 is located on the back of the wafer. Contact piston 21 may be contacted by using either wire bonds on bond pad 28 or using a solder ball in the case of a flip-chip structure. To that end, however, it is necessary for contact piston 21 to be mechanically enclosed. In this case, the mechanical enclosure must not be conductive or must at least be designed to have very high resistivity.

Figure 2:
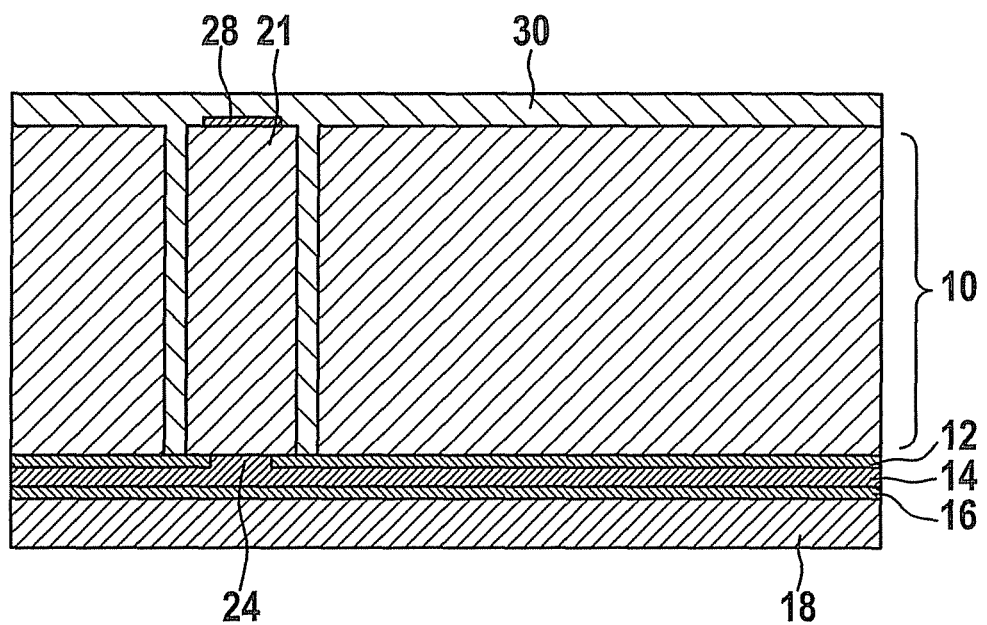
FIG. 2 shows a cross-sectional view of a process stage of the filling of the insulation trenches corresponding to the first specific embodiment of the present invention.

FIG. 2 is a cross-sectional view of the wafer according to FIG. 1 after application of a filling material 30.

According to the exemplary embodiment of the present invention, filling material 30 is a polymer which satisfies the following requirements: low absorption of humidity, high electrical resistance, an adequately high modulus of elasticity and a thermal coefficient of expansion which is as similar as possible to that of silicon. Polymers that meet these requirements are polyimide or a substance known by the trade name Cyclotene 3022-63. The latter also has the advantage of being highly temperature-resistant. The polymer used is advantageously applied to the back surface of the wafer using rotation coating which is also referred to as spin coating. This is followed by a heating referred to as a prebake in order to drive out solvents. In the case of Cyclotene, a temperature of approximately 120° C. is suitable for this. After that, a heating step referred to as a flow bake is performed under vacuum. During this heating step, polymer flows back from the surface into the cavities to be filled so that possible gas or air bubbles are driven out. If Cyclotene is used, this step is performed at approximately 120° C. to 170° C. Finally, the polymer is cured in a heating step referred to as a hard-cure. In the case of Cyclotene, a temperature of approximately 250° C. is sufficient for this.

Figure 3:
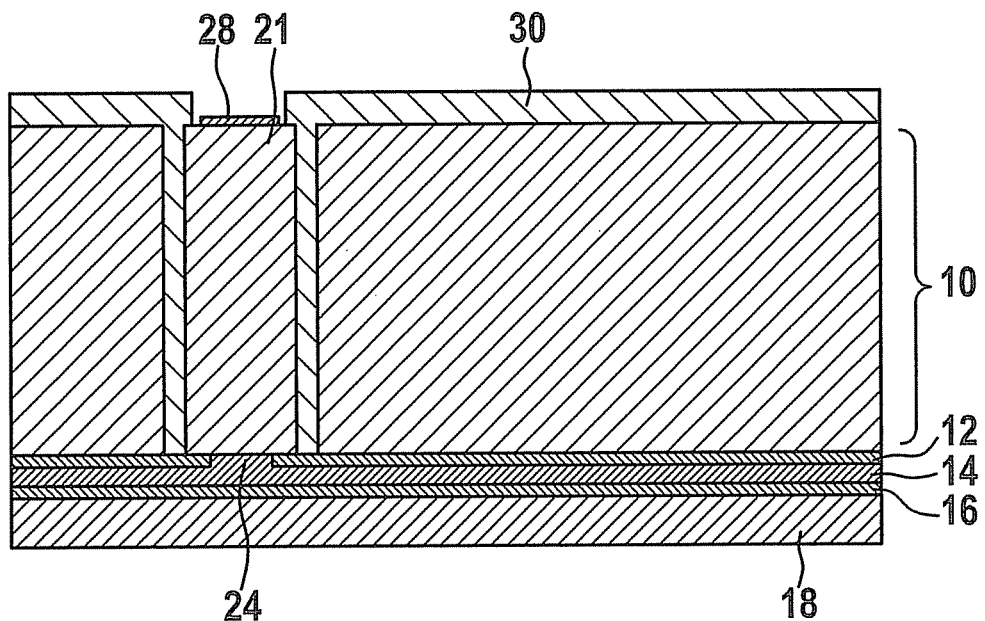
FIG. 3 shows a cross-sectional view of an additional process stage of the filling of the insulation trenches corresponding to the first specific embodiment of the present invention.

FIG. 3 is a cross-sectional view of another process stage of the method according to the first exemplary embodiment of the present invention.

After polymer 30 is cured, the polymer located on the wafer surface is structured to expose bond pad 28. If a photosensitive polymer is used, it may be structured directly using photolithography. Non-photoactive polymers are dry chemical etched using a lacquer mask of metal or oxide. Since polymer 30 remains on the wafer surface and only an access to bond pads 28 is opened, polymer 30 may be used additionally as a passivation of the back of the wafer or as electrical insulation for a redistribution wiring.

Figure 4:
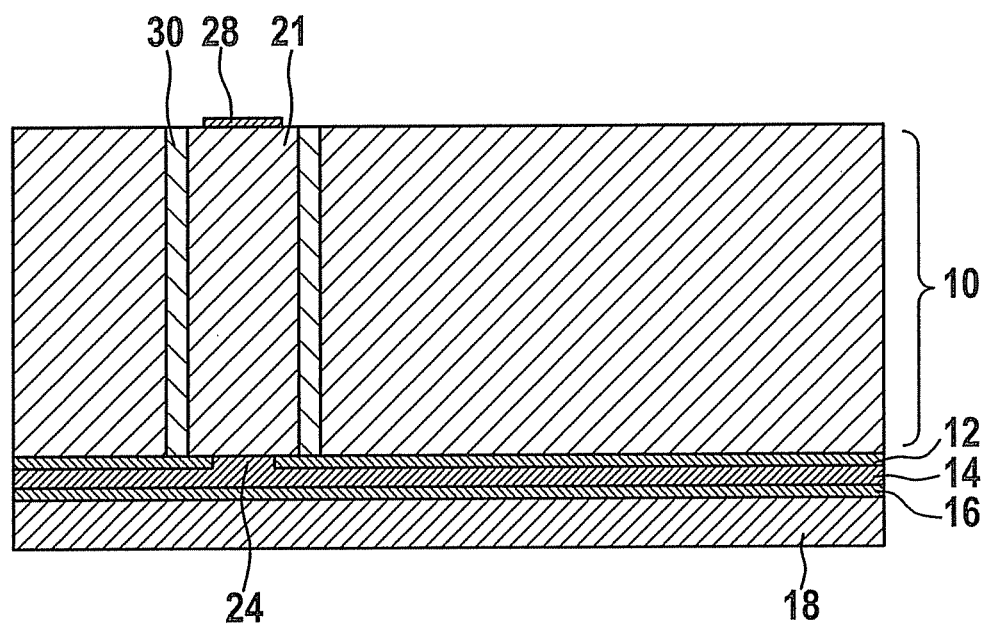
FIG. 4 shows a cross-sectional view of an additional process stage of the filling of the insulation trenches corresponding to a second specific embodiment of the present invention.

FIG. 4 is a cross-sectional view of another process stage of the method according to a second exemplary embodiment of the present invention.

As an alternative to the first exemplary embodiment, bond pads 28 may also be exposed by completely removing the polymer located on the back of the wafer and leaving the polymer only in insulation trenches 20A. There is a plurality of possibilities for removing the polymer. The polymer may be etched back by reactive ion etching. Alternatively, the polymer may be removed from the wafer surface before curing in the hard-cure step by rinsing using solvent or wet chemical spin etching. Finally, the polymer may be removed from the wafer surface using polish grinding.

Figure 5:
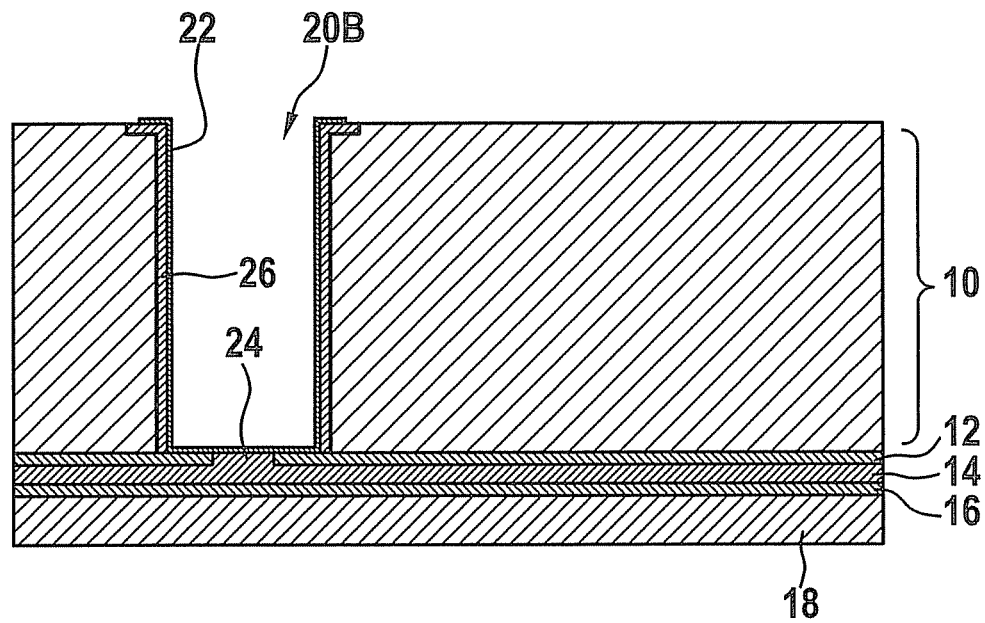
FIG. 5 shows a cross-sectional view of a wafer having a metallic hollow via corresponding to a third specific embodiment of the present invention.

FIG. 5 is a cross-sectional view of a wafer having a metallic hollow via.

According to a third exemplary embodiment of the present invention, the cavity to be filled is a hollow via 20B which is used for contacting a buried printed conductor track 14. The structure of the wafer is identical to that of the first exemplary embodiment. However, instead of the silicon via, it has a contact hole which is lined with a metal layer 22. On the bottom of the contact hole, metal layer 22 is connected to buried printed conductor track 14 via an electrically conductive connection 24. Metal layer 22 is insulated from substrate 10 by a dielectric layer 26. Hollow via 20B is filled in a way similar to the filling of insulation trenches 20A of the first two exemplary embodiments.

Figure 6:
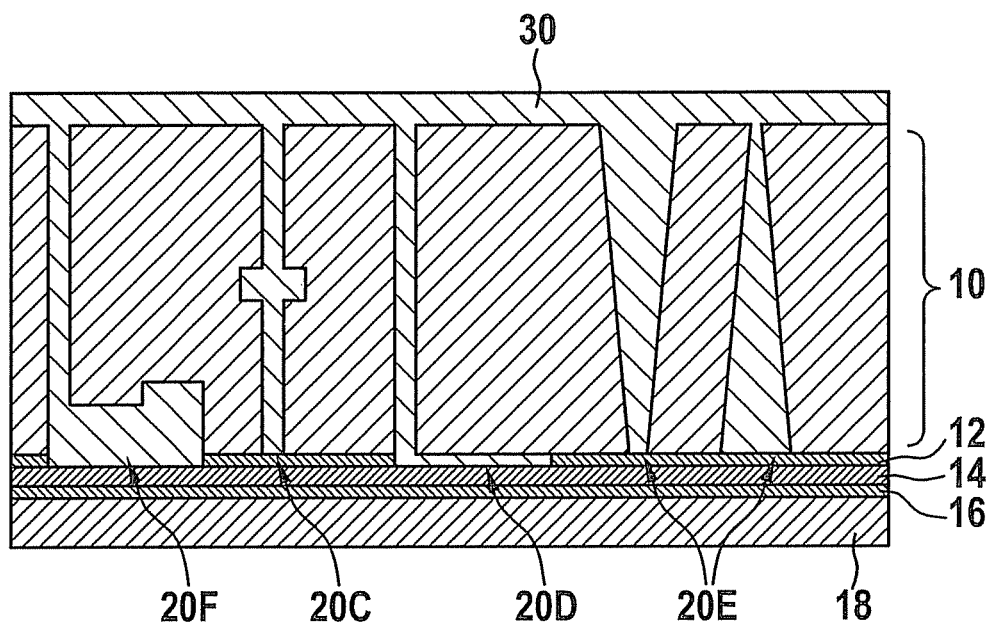
FIG. 6 shows a cross-sectional view of a wafer having various filled cavities corresponding to a fourth specific embodiment of the present invention.

FIG. 6 is a cross-sectional view of a wafer having differently shaped cavities.

FIG. 6 shows examples of different geometries for which the method according to the present invention is suitable. Similar to the method described in connection with the first and the second exemplary embodiment, trenches 20C having an undercut, undercuts including chambers 20F, lateral cavities 20D and tapering or widening trenches 20E may be filled without the formation of voids.

What is claimed is:
1. A method for filling cavities in wafers, the cavities being open to a predetermined surface of the wafer, the method comprising:
    applying only one single lacquer-like filling material to the predetermined surface of the wafer;
    filling the cavities with the only one single lacquer-like filling material applied to the predetermined surface;
    heating the wafer at a first temperature;
    driving out gas bubbles enclosed in the filling material by heating the wafer under vacuum at a second temperature which is equal to or higher than the first temperature;

curing the filling material by heating the wafer at a third temperature which is higher than the second temperature.

2. The method of claim 1, wherein the filling material is a material which is liquid at the second temperature.

3. The method of claim 1, wherein the filling material is a polymer, which is one of a polyimide and a benzocyclobutene compound.

4. The method of claim 1, wherein the third temperature is lower than 250° C.

5. The method of claim 1, wherein at least one of the cavities has at least one undercut.

6. The method of claim 1, wherein at least one of the cavities is one of a metallic hollow via and an insulation trench of a silicon via.

7. The method of claim 6, further comprising:
structuring the filling material applied to the predetermined surface of the wafer for exposing terminal contacts of the metallic hollow via or the silicon via.

8. The method of claim 6, further comprising:
removing the filling material applied to the predetermined surface of the wafer for exposing terminal contacts of one of the metallic hollow via and the silicon via.

9. The method of claim 1, further comprising:
rotation coating the single lacquer-like filling material on the predetermined surface of the wafer to fill to the cavities.

10. A method for filling cavities in wafers, the cavities being open to a predetermined surface of the wafer, the method comprising:
applying a single lacquer-like filling material to the predetermined surface of the wafer;
filling the cavities with the single lacquer-like filling material applied to the predetermined surface;
heating the wafer at a first temperature;
driving out gas bubbles enclosed in the filling material by heating the wafer under vacuum at a second temperature which is equal to or higher than the first temperature;
curing the filling material by heating the wafer at a third temperature which is higher than the second temperature;
affixing a terminal contact to the predetermined surface before applying the single lacquer-like filling material; and
removing only a portion of the filling material covering the terminal contact after curing the filling material.

* * * * *